United States Patent
Väisänen

[19]

[11] Patent Number: 6,144,243

[45] Date of Patent: Nov. 7, 2000

[54] METHOD AND CIRCUIT ARRANGEMENT FOR REDUCING OFFSET VOLTAGE OF A SIGNAL

[75] Inventor: Risto Väisänen, Salo, Finland

[73] Assignee: Nokia Mobile Phones Ltd., Espoo, Finland

[21] Appl. No.: 09/117,751

[22] PCT Filed: Feb. 6, 1997

[86] PCT No.: PCT/FI97/00072

§ 371 Date: Oct. 9, 1998

§ 102(e) Date: Oct. 9, 1998

[87] PCT Pub. No.: WO97/29551

PCT Pub. Date: Aug. 14, 1997

[30] Foreign Application Priority Data

Feb. 8, 1996 [FI] Finland ................................. 960578

[51] Int. Cl.[7] .................................................. H03L 5/00
[52] U.S. Cl. .......................................................... 327/307
[58] Field of Search ............................ 327/307; 375/317, 375/318, 319; 455/212, 214, 303, 305, 306, 312

[56] References Cited

U.S. PATENT DOCUMENTS

| 4,514,685 | 4/1985 | Gilker ........................................ 324/142 |
| 4,713,563 | 12/1987 | Marshall et al. ........................ 307/490 |
| 4,745,594 | 5/1988 | Takahashi .................................. 370/51 |
| 5,212,826 | 5/1993 | Rabe et al. ................................ 455/214 |
| 5,748,681 | 5/1998 | Comino et al. ........................... 375/319 |
| 5,945,864 | 8/1999 | Weber et al. ............................. 327/307 |

FOREIGN PATENT DOCUMENTS

| 0594894 A1 | 5/1994 | European Pat. Off. . |
| 2210744 | 6/1989 | United Kingdom . |
| 2268648 | 1/1994 | United Kingdom . |
| WO 88/02581 | 4/1988 | WIPO . |
| WO 92/11703 | 7/1992 | WIPO . |

*Primary Examiner*—Jeffrey Zweizig
*Attorney, Agent, or Firm*—Perman & Green, LLP

[57] ABSTRACT

The invention relates to a method and a circuit arrangement for reducing the offset voltage of a signal. The invention can be applied preferably in direct conversion receivers which are used, for example, in mobile stations used in digital time-division cellular systems. According to the invention, the direct voltage component of a signal is separated by a capacitor (C1) and the offset voltage is reduced by connecting a second signal (S2) to the output (P2) of the capacitor, the amplitude of this signal being determined on the basis of a first signal (S1) preceding the capacitor (C1). The second signal (S2) is formed preferably by high-pass filtering said first signal (S1) and by summing a reference voltage (Vref) to the high-pass filtered signal (S3). By using the solution according to the invention, it is possible to reduce the offset voltage also when there are no breaks in the received baseband signal.

16 Claims, 8 Drawing Sheets

METHOD AND CIRCUIT ARRANGEMENT FOR REDUCING OFFSET VOLTAGE OF A SIGNAL

FIELD OF THE INVENTION

The invention relates to a method and a circuit arrangement for reducing the offset voltage of a signal. The invention can be applied preferably in receivers of digital, time-division systems for data transfer such as in mobile stations. The offset voltage refers to voltage which has become summed up into a signal, essentially direct voltage which is not included in the received useful signal.

BACKGROUND ART

One general problem is that the offset voltage becomes summed up into baseband signals. This can happen, for example, in I/Q receivers which are used in mobile communications, that is receivers in which a baseband in-phase signal and quadrature signal are formed. The problem is a particular problem in so-called direct conversion receivers in which the received signal is converted directly to a baseband and the baseband extends to near the zero frequency. Then the offset voltage may be considerably higher than the pre stage noise in which case the signal-to-noise ratio deteriorates largely due to this effect of the offset voltage.

The formation of the offset voltage can be due to many different factors:

The local oscillator of a receiver may itself become linked to the front of the receiver that is to high-frequency parts in which case the local oscillator signal obtains access to the radio frequency gate that is to the RF gate of the I/Q modulator and becomes mixed with the actual local oscillator signal which is entering the local oscillator gate, that is the LO gate at the actual mixer and forms an offset signal at the output of the mixer. The strength of this signal will depend on the phase and level of the local oscillator signal. This phenomenon has been described in more detail, for example, in U.S. Pat. No. 5,212,826.

Secondly, the harmonic frequency of the clock oscillator which impacts on the channel frequency can become mixed with the local oscillator signal and form direct voltage at the output of the mixers in the I/Q demodulator.

At the receivers using intermediate frequency, the second local oscillator signal can itself become linked to the first local oscillator signal, in which case the signals get mixed with each other in the first mixer and as a result they form a mixing result which impacts on the intermediate frequency and generates offset voltage at the output of the I/Q demodulator.

In addition, offset voltage can be generated into baseband signals from switching on the supply voltages of the receiver.

The above mentioned phenomena which lead to the generation of offset voltage are not described in more detail in this context because these phenomena are prior known to a person skilled in the art. Also several methods are prior known for removing the offset voltage:

If the offset voltage stayed constant during the entire reception time, it would be possible to remove the offset voltage digitally. In that case, the dynamics of the analog/digital converter, that is the A/D converter should, however, be extended by the highest possible offset voltage, which would raise considerably the price of the A/D converters. In addition, extra digital signal processing would require higher clock frequencies, which in turn would lead to increased current consumption by the device.

Problems which are due to leakage and detrimental connection of signals can be reduced by increasing RF shielding but this will lead to an increase in the size and weight of the device, and especially with respect to direct conversion receivers it is not possible to adequately resolve the problem with this approach.

By using two intermediate frequencies, the problem can be overcome almost entirely but, due to large amount of components and intermediate frequency filters needed, the receiver will be expensive and large in size.

Figure 1:
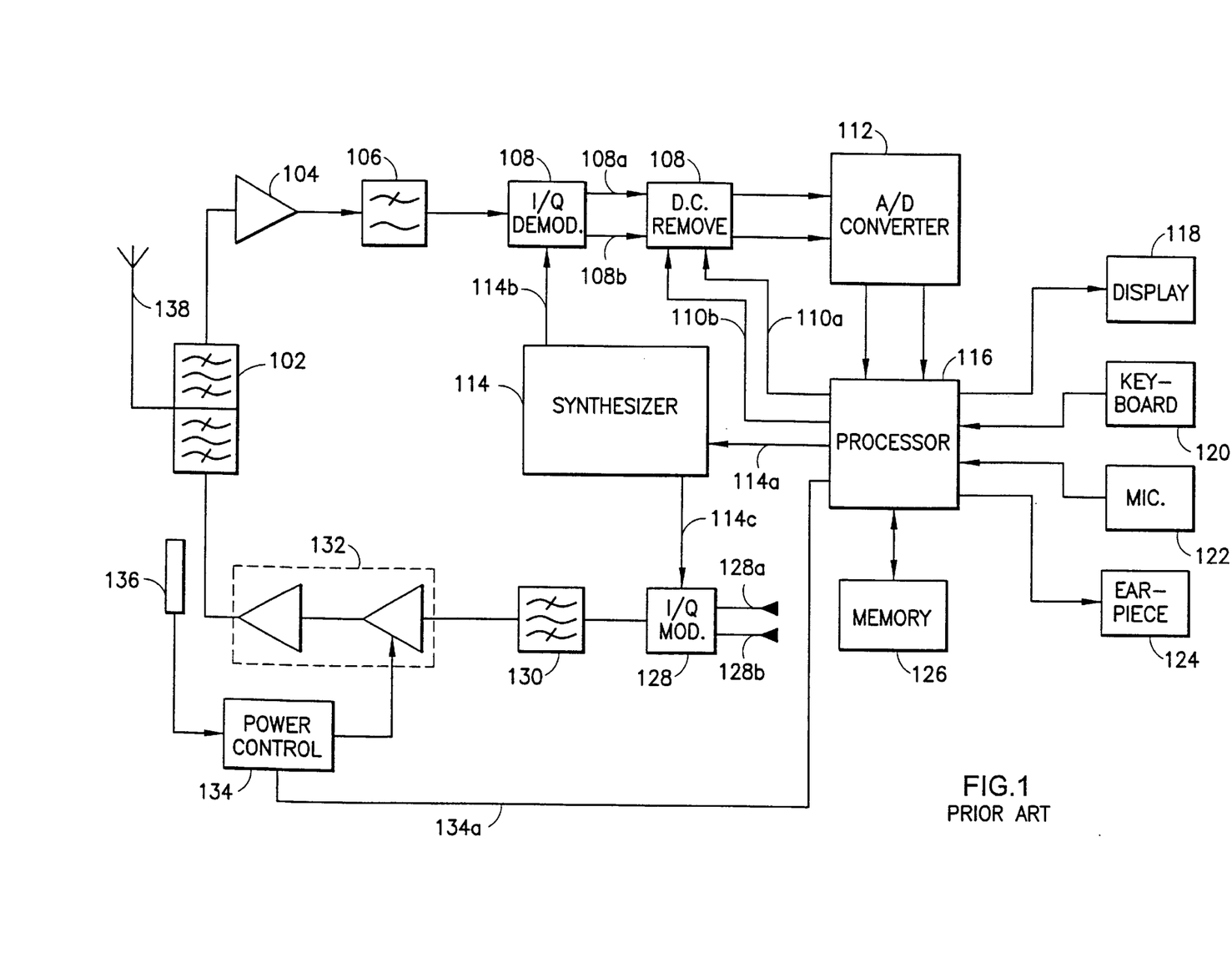
FIG. 1 shows a block diagram of a prior known mobile station in which a direct conversion receiver has been used.

FIG. 1 shows a prior known block diagram of a transmitter-receiver of a mobile station and in this block diagram, the receiver is a so-called direct conversion receiver. An RF signal received by an antenna 138 is conducted via a duplex filter 102 to a pre-amplifier 104. The purpose of the duplex filter is to permit the use of the same antenna both in transmitting and in receiving. Instead of a duplex filter, also a synchronous antenna changeover switch can be used in a time-division system. An RF signal received from an amplifier 104 is low-pass filtered 106 and demodulated in an I/Q demodulator 108 into an in-phase signal 108*a* and into a quadrature signal 108*b*. A local oscillator signal 114*b* which is needed in demodulation is received from a synthesizer 114. In block 110, removal of direct voltage and automatic gain control (AGC) are carried out. Block 110 is controlled by a processing block 116 which may contain, for example, a microprocessor. Automatic gain control is regulated by a signal 110*a* and removal of offset voltage is regulated by a signal 1100*b*. Signals received from the block 110 are converted into digital signals in block 112 from which the signals are further transferred to digital signal processing circuits in the processing block 116.

The transmitter unit comprises an I/Q modulator 128 which forms from an in-phase signal 128*a* and from a quadrature signal 128*b*, a carrier-frequency signal which is low-pass filtered and/or high-pass filtered by a filter 130. The carrier-frequency signal is amplified by an RF amplifier 132 and the amplified signal is transferred via a duplex filter 102 to the antenna 138. A power control unit 134 of the transmitter controls the amplification of the RF amplifier 132 on the basis of the measured output power 136 and of the control 134*a* received from the processor.

FIG. 1 also shows, to the processing unit, the memory unit 126 and user interface means which comprise a display 118, a keyboard 120, a microphone 122 and an earpiece 124.

In the following, a prior known circuit arrangement for reducing offset voltage is described in more detail by means of FIG. 2, and this is linked to the block 110 of the receiver shown in FIG. 1. Application of a solution such as this in a time division multiple access (TDMA) has been described, for example, in U.S. Pat No. 5,212,826.

Figure 2:
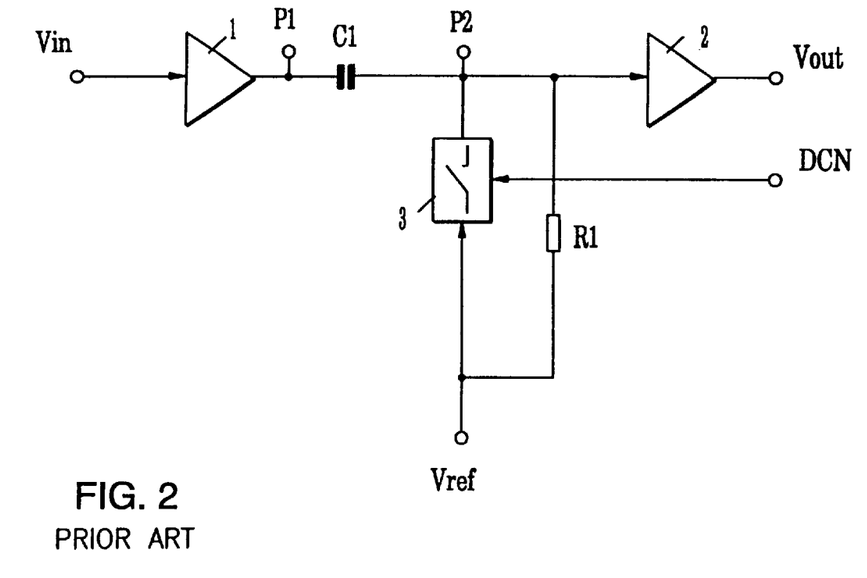
FIG. 2 shows a prior art circuit arrangement for removing the offset voltage.

In a circuit according to FIG. 2, a baseband signal Vin is conducted to an amplifier 1, the output P1 of which has been conducted via a capacitor C1 to the input P2 of an amplifier 2. In the place of the amplifier 2 there can also be, for example, an analog/digital converter. To the input of the amplifier 2, a reference voltage has been conducted via a resistor R1. Prior to the start of the receiving, a short control pulse DCN switches a switch 3 into an on-state in which case the output terminal of the capacitor C1 becomes set at a reference voltage Vref and at the point P2 if there is any offset voltage, it is dissipated.

Figure 3:
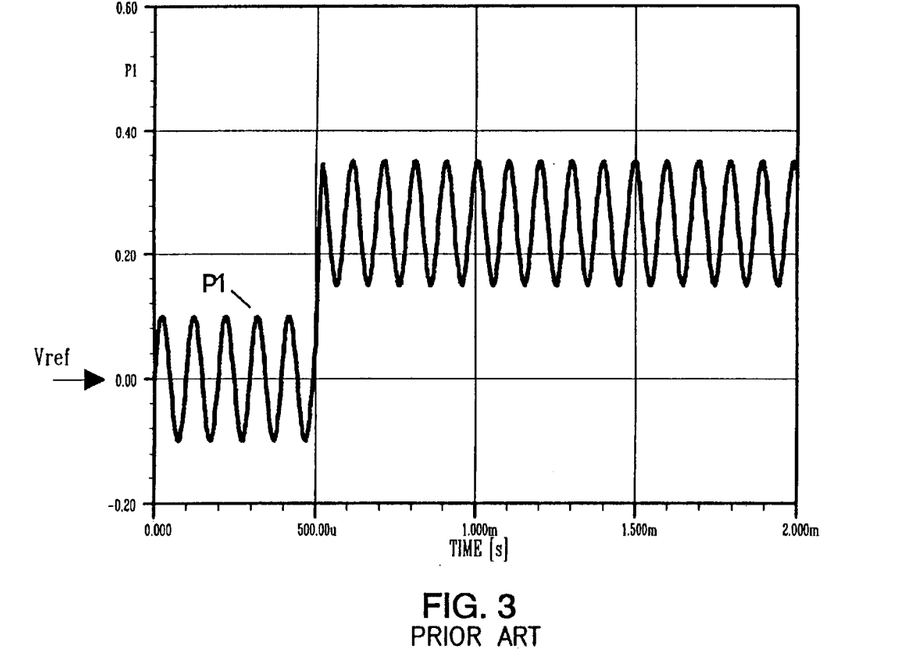
FIG. 3 shows an input signal occurring in a circuit arrangement according to FIG. 2.
Figure 4:
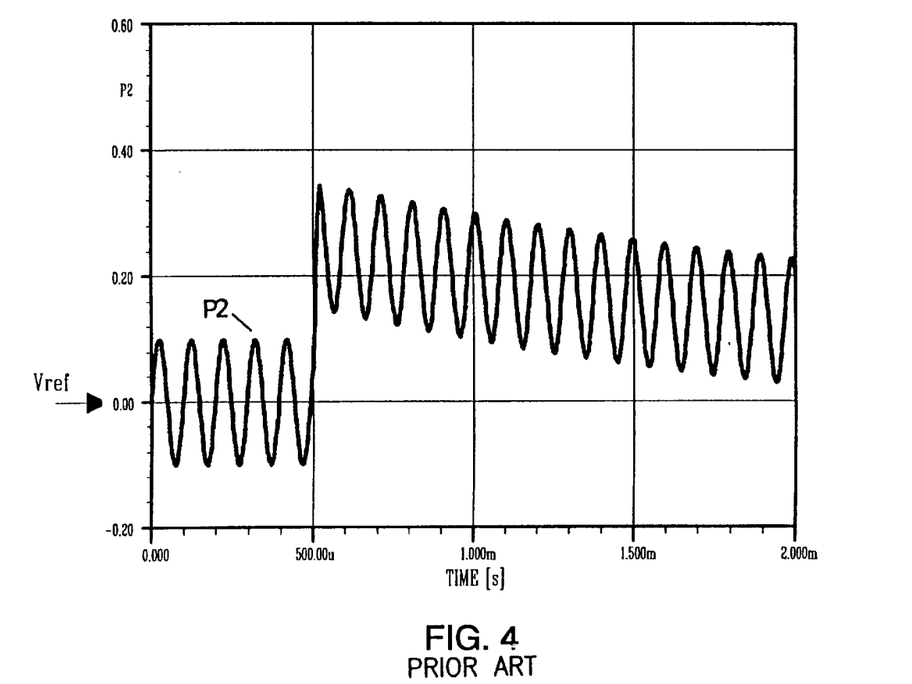
FIG. 4 shows an output signal occurring in a circuit arrangement according to FIG. 2.

FIG. 3 shows a baseband signal occurring at point P1, in which signal an offset voltage is generated at the time point 0.5 ms. In this figure, like in all the other enclosed figures showing signals, the vertical axis shows the amplitude of the signal and the horizontal axis shows the time. If the DCN pulse is not used, at the point P2 and at the output signal Vout there occurs, in addition to the baseband signal, a slowly falling offset voltage that is the direct voltage component which approaches slowly the value Vref. A signal occurring at point P2 has been shown in FIG. 4. It is to be noted that the offset voltage can be reduced by using the mere capacitor C1 on its own. The capacitor C1 has to be, however, designed on the basis of the lower limiting frequency of the baseband signal, which is the reason why the time constant of the reduction of the offset voltage is far too great in practice.

Figure 5:
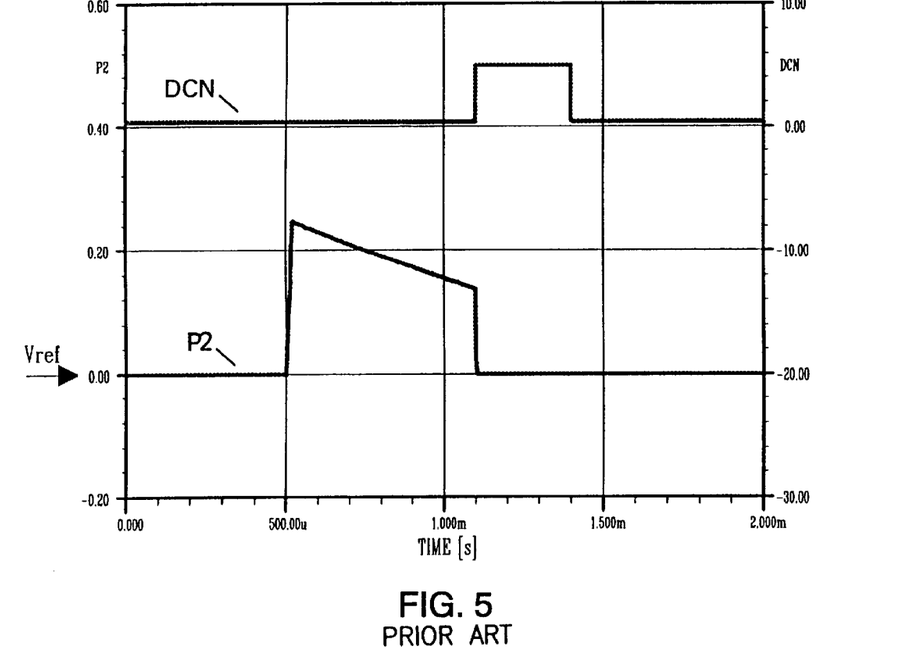
FIG. 5 shows an offset voltage and a control pulse occurring in a circuit arrangement according to FIG. 2.

FIG. 5 shows a situation where there is no baseband signal Vin on the signal path but at point P2 there occurs only the generating offset voltage which is removed by using the DCN control pulse shown also in FIG. 5. It is easy to observe from FIG. 5 that after the rise of the DCN control pulse, the offset voltage occurring at point P2 is dissipated.

Figure 6:
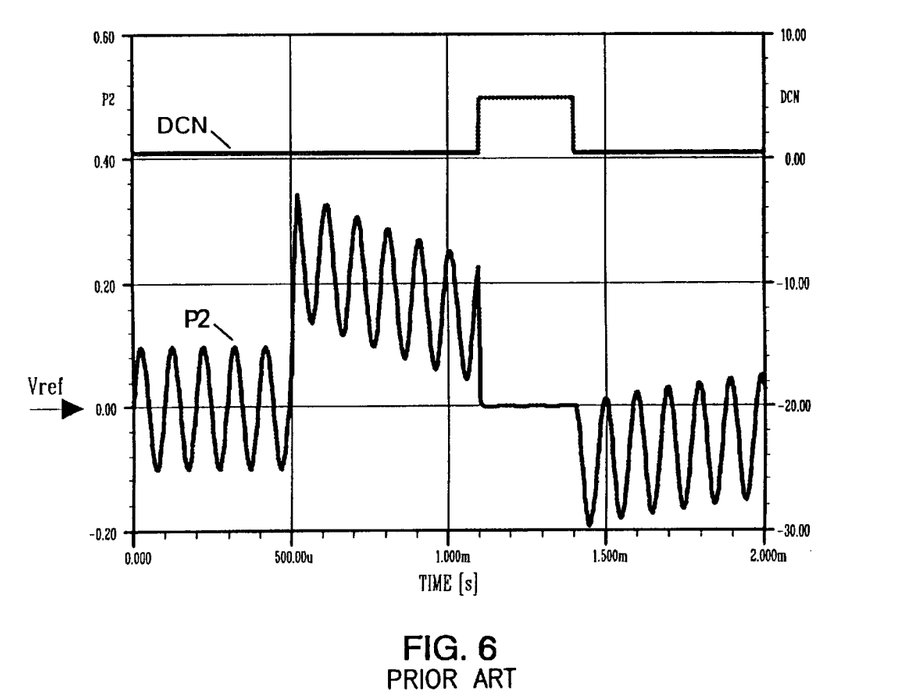
FIG. 6 shows a baseband signal, an offset voltage and a control pulse occurring in a circuit arrangement according to FIG. 2.

FIG. 6 shows a situation where on the signal path there is a baseband useful signal in addition to the offset voltage. The DCN control pulse removes the offset voltage occurring at point P2 in the same way as in the case shown in FIG. 5 but, as the DCN control pulse ends, a negative offset voltage is generated at point P2. In this situation, the offset voltage is not dissipated but the operation of the removing circuit of the offset voltage results in a new offset voltage which falls slowly towards the reference voltage Vref. This new offset voltage caused by the removing circuit of the offset voltage depends on how great the instantaneous value of the baseband signal occurring in the capacitor C1 is at the moment when the DCN control pulse ends.

In order to circumvent the new offset voltage resulting from the removing circuit of the offset voltage, in the solution described above, the zeroing of the offset voltage should be performed at such an instant when the received signal is essentially noise, which means in practice before the onset of the signal reception. In many time-division systems for mobile communications, such as GSM (Global System for Mobile Communications) and PCN (Personal Communications Network) systems, the power transmitted by the base station is not disconnected before the start of a new time interval. Thus there are baseband signals present in a receiver also before the start of the actual moment of reception, that is during the time when the offset voltage should be removed. This is why the earlier mentioned solution for reducing the offset voltage is not applicable in the above mentioned systems.

SUMMARY OF THE INVENTION

The object of the invention is to devise a solution for reducing the offset voltage of a signal and avoiding the disadvantages associated with the above described solutions according to prior art.

One idea of the invention is that, at the output of a separating means of direct voltage, such as a capacitor, a second signal is connected which is formed preferably by high-pass filtering on the basis of the first signal which precedes the separating means. In this way, the value of the useful signal can be taken into consideration during the connection of the second signal and the generation of a new offset voltage caused by the connection of the second signal can be avoided. The "input" and the "output" of the separating means have been defined here on the basis of the direction of motion of the useful signal.

A method according to the invention is characterized by the fact that the second signal which is connected to the output of the separating means of the direct voltage is formed on the basis of the first signal preceding the above mentioned separating means. The circuit arrangement according to the invention is characterized by the fact that it comprises the means for forming said second signal on the basis of the first signal preceding the separating means. Preferable embodiments of the invention have been presented in the dependent claims.

BRIEF DESCRIPTION OF THE DRAWINGS

The invention is described in the following in more detail by using the attached drawings in which.

DETAILED DESCRIPTION OF THE PREFERRED EMBODIMENTS

FIGS. 1–6 were described above in the context of the description of the prior art. In the following, a method according to the invention is described briefly by using FIG. 7 and a circuit arrangement according to the invention and its operation are described by using FIGS. 8 and 9. Thereafter, some embodiments of the invention are described by using FIGS. 10–12.

Figure 7:
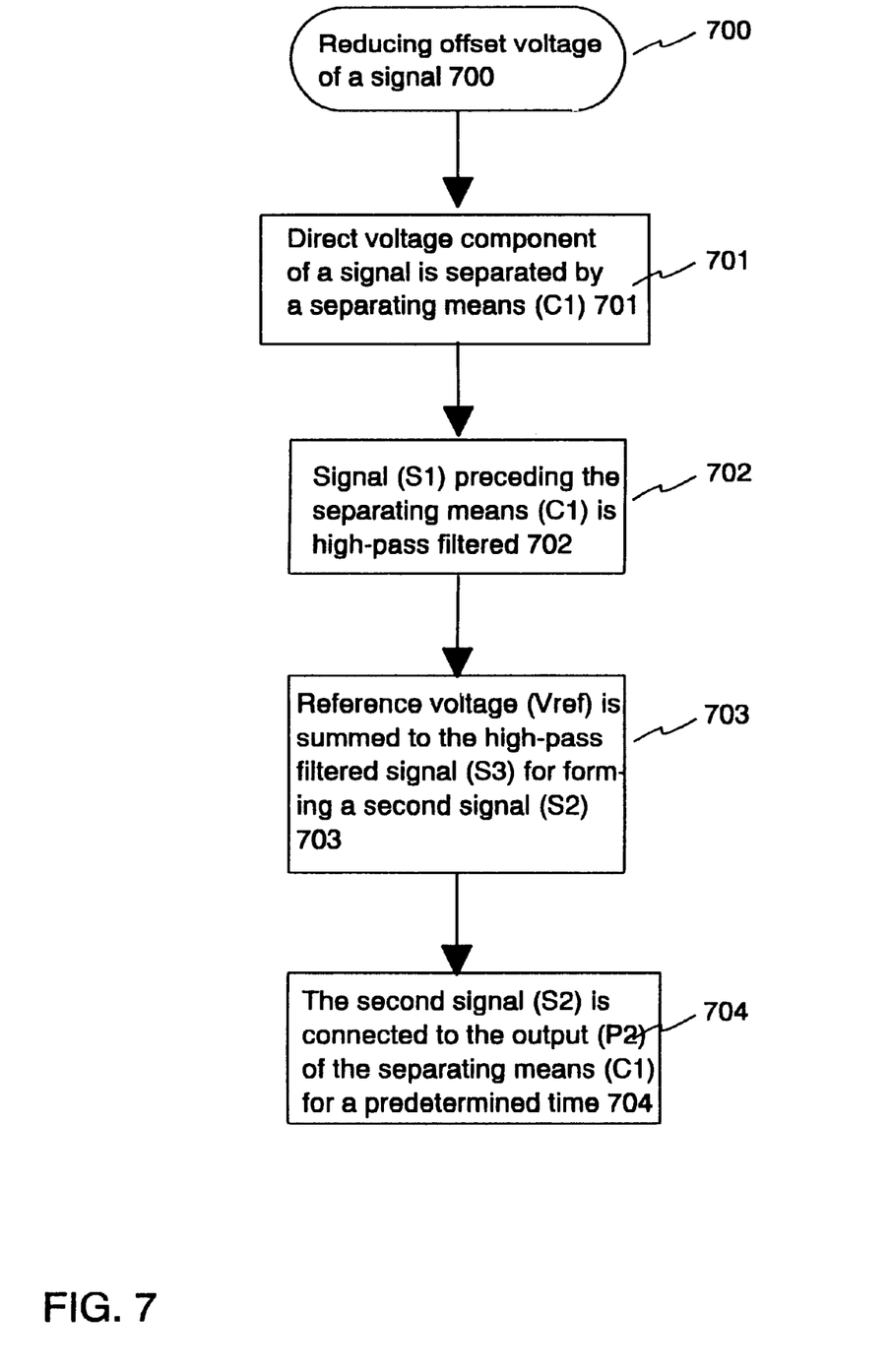
FIG. 7 shows a flow diagram of a method according to the invention.

FIG. 7 shows a flow diagram of a method 700 according to the invention for reducing the offset voltage of a signal. In this method, a direct voltage component of a signal is separated by a separating means such as a capacitor C1, block 701. Simultaneously, the first signal S1 which precedes the separating means is high-pass filtered 702 and the high-pass filtered signal S3 is summed to the reference voltage Vref to produce a second signal S2 in block 703. Finally, the produced second signal S2 is connected to the output P2 of the separating means C1 for a predetermined time. Since virtually the same baseband signal then forms the input into both terminals of the separating means, the baseband signal does not form any significant new offset voltage at the output of the separating means when the connection of the second signal S2 is disconnected from the output of the separating means.

Figure 8:
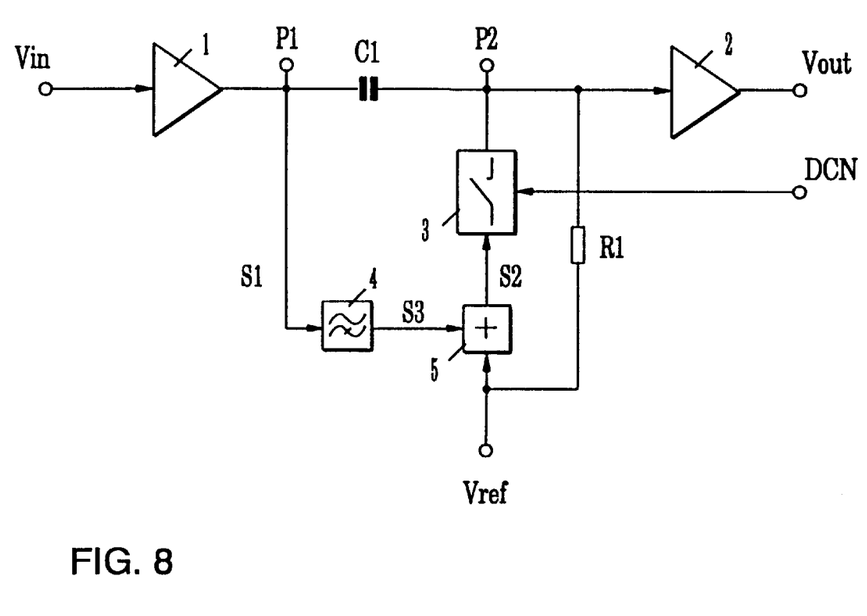
FIG. 8 shows a circuit arrangement according to the invention.

FIG. 8 shows a diagram depicting the principles of a circuit arrangement according to the invention. The circuit arrangement can be applied, for example, in the block 110 of the transmitter/receiver unit of a mobile station shown in FIG. 1. In the arrangement shown in FIG. 8, a baseband signal Vin is conducted to the input of the amplifier 1 and the first signal S1 occurring at the output P1 of the amplifier 1 has been conducted into two branches: via the capacitor C1 to the amplifier 2 and via the high-pass filter 4 to the summer 5. By using the summer, the high-pass filtered signal S3 is summed to the reference voltage Vref. The result of the summing, that is the second signal S2, is led to the switch 3 which is controlled to an on-state by a short control pulse DCN. At the terminals of the capacitor C1, there is during the entire DCN control pulse virtually the same baseband signal and thus there is hardly any charge created by the baseband signal in the capacitor. In that way no significant offset voltage is formed at the output when the DCN control pulse ends and the switch 3 is opened.

In the solution according to the invention, the baseband signal passing through the signal line is not interrupted for the duration of the DCN control pulse but a high-pass filtered baseband signal occurs at the output of the capacitor during the DCN control pulse. The lower limiting frequency of the high-pass filter 4 is preferably higher than the lower limiting frequency of the signal line. Then the offset voltage occurring in the second signal is attenuated rapidly and by connecting the second signal to the output of the separating means, also the offset voltage occurring in it can be rapidly reduced. The higher lower limiting frequency of the high-pass filter does not, however, have any effect on the band of the actual signal line except during the DCN control pulse.

Figure 9:
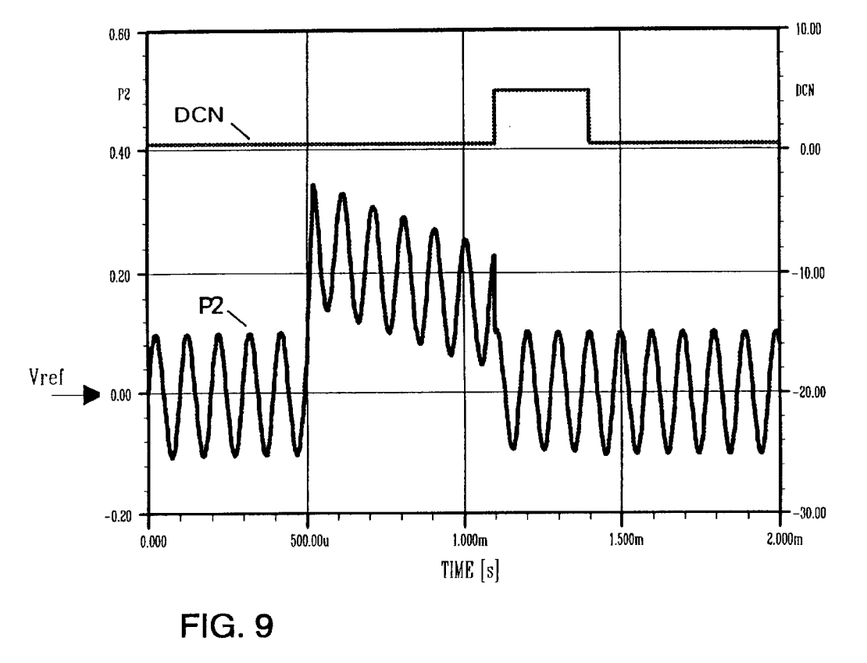
FIG. 9 shows signals occurring in a circuit arrangement according to FIG. 8.

FIG. 9 shows the result of the simulation of the operation of the solution shown in FIG. 6. In it, a similar baseband signal and offset voltage as in the situation shown in FIG. 5 have been fed into the circuit. One can observe in FIG. 7 that at the onset of the DCN control pulse the offset voltage is dissipated in a way similar to the situation shown in FIG. 5 but at the end of the DCN control pulse no change occurs in the direct voltage part of the output signal and thus the offset voltage is essentially dissipated.

Figure 10:
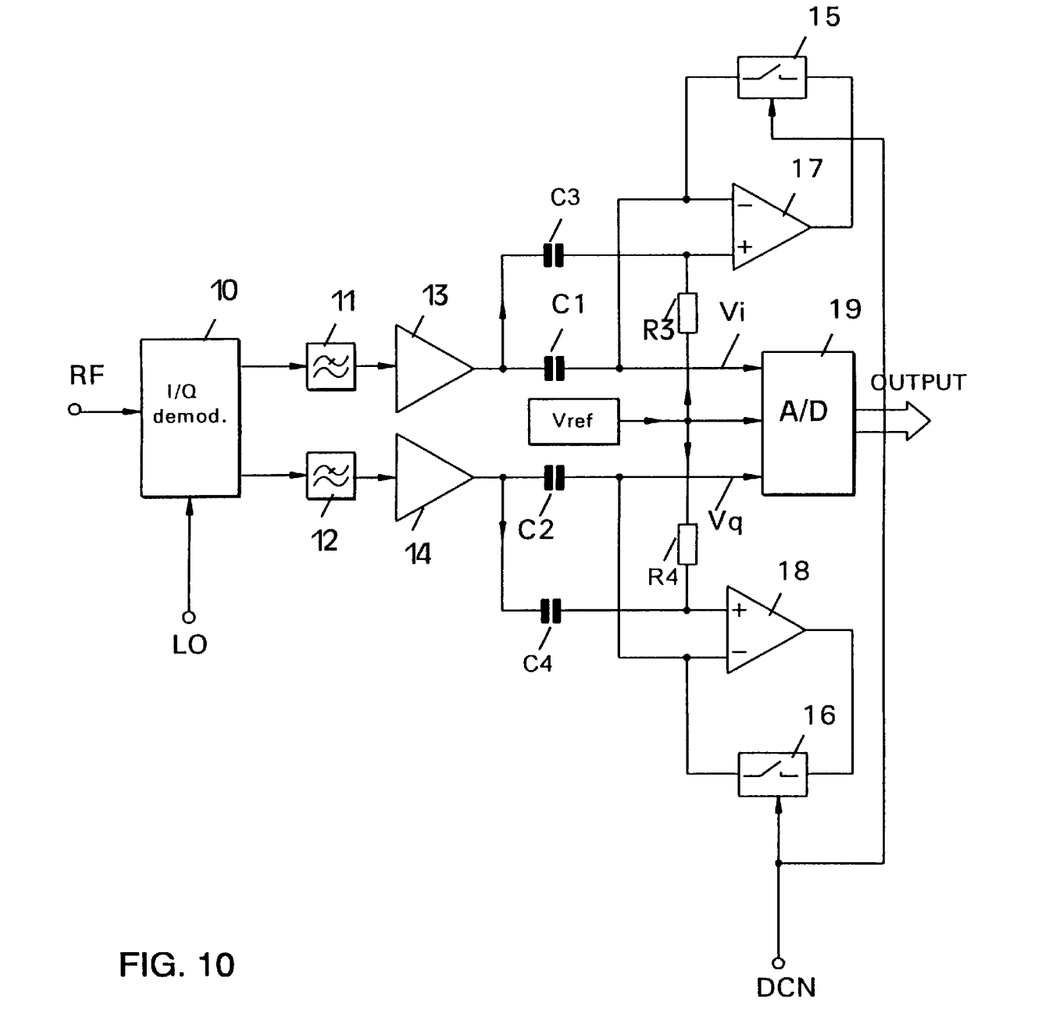
FIG. 10 shows a diagram presenting the principle of a circuit arrangement according to the invention for reducing the offset voltage of a signal, and in this circuit arrangement controllable switches have been used.

FIG. 10 shows a diagram depicting the principles of a circuit arrangement according to the invention. In it, from the I/Q demodulator 10 I and Q signals are obtained which are conducted via low-pass filters 11 and 12 to amplifiers 13 and 14 which have an automatic gain control (AGC). Both I and Q signals are branched thereafter into two branches of which the first branches have been conducted via DC separating capacitors C1 and C2 to the inputs Vi and Vq of an A/D converter block 19. The second branches have been conducted via high-pass filters formed by capacitors C3 and C4 and by resistors R3 and R4 to active switching elements which consist of operational amplifiers 17 and 18 as well as of switches 15 and 16. The switching elements are controlled by a control pulse DCN which is received from the digital parts. The resistors R3 and R4 have been connected to the reference voltage Vref in which case said reference voltage is summed to the high-pass filtered signal. When the switches 15 and 16 are controlled to an on-state, to the output of the separating capacitors C1 and C2, the second signals become connected. They are the sum signals of the reference voltage Vref and the high-pass filtered I and Q signals.

Figure 11:
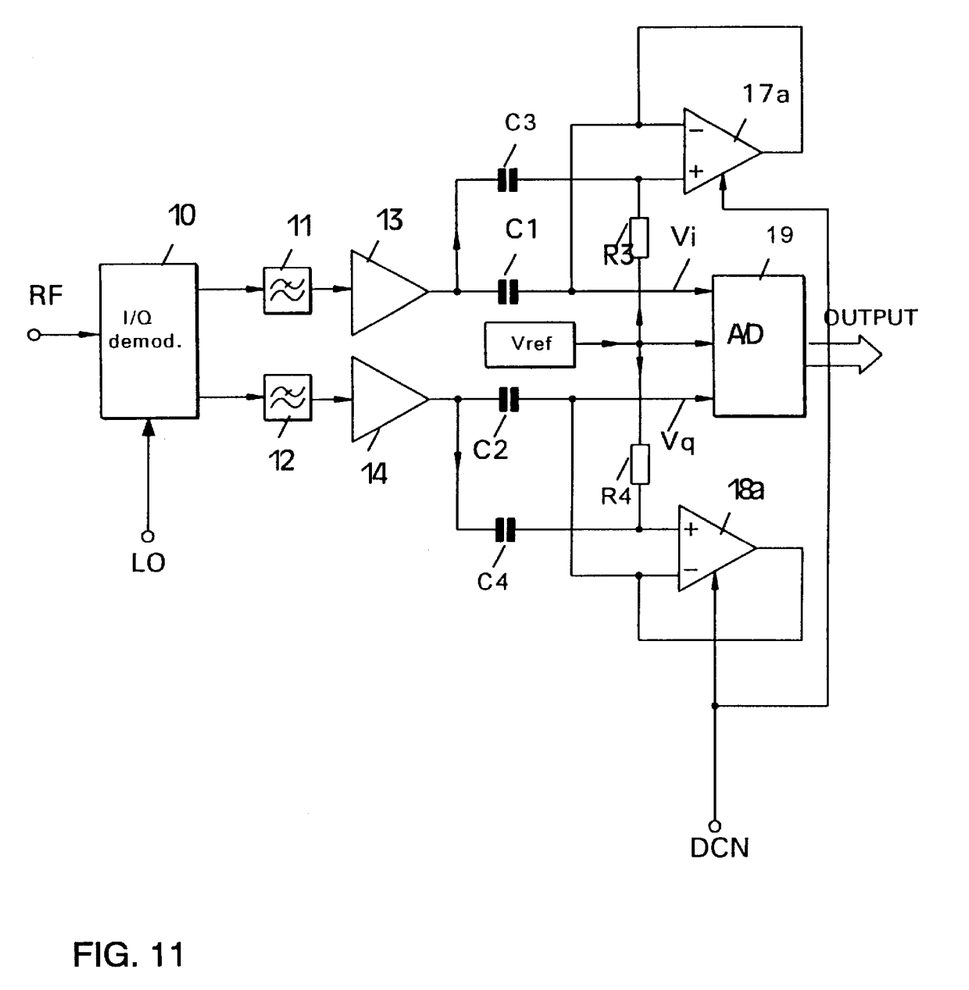
FIG. 11 shows a diagram presenting the principle of a circuit arrangement for reducing the offset voltage of a signal according to the invention, and in this circuit arrangement, operational amplifiers have been used as switching means and their output can be controlled into a high impedance state.

FIG. 11 shows a solution which operates otherwise in a similar way as FIG. 10 but in the solution shown in FIG. 11, operational amplifiers 17a and 18a operate as active switching elements and their outputs can be controlled to a high-impedance state. Then the operational amplifiers 17a and 18a are controlled by a control signal DCN in such a way that their outputs are in a high-impedance state at any other time except during the DCN control pulse when the output of the operational amplifiers is in an active state.

Figure 12:
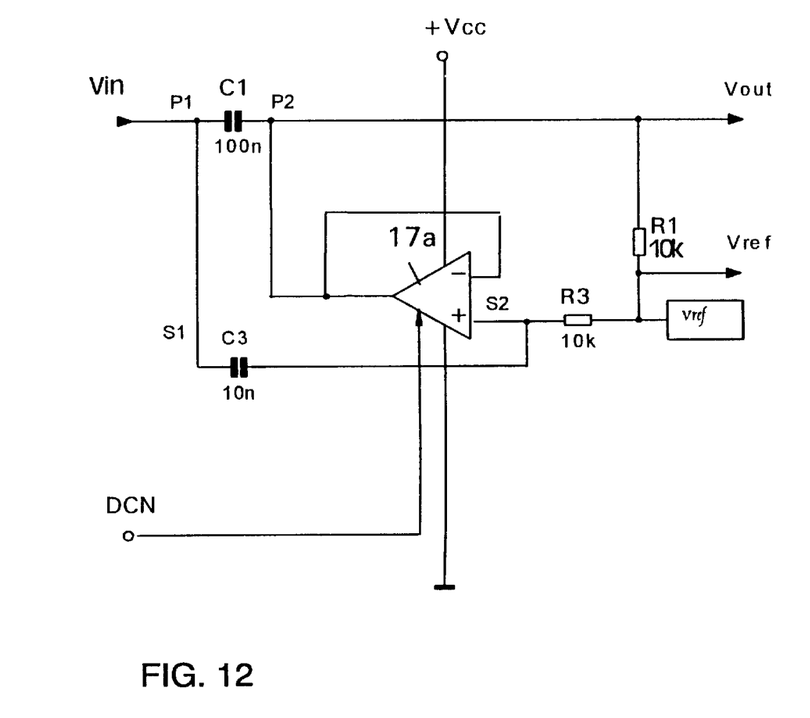
FIG. 12 shows a practical implementation of a solution according to the invention as a circuit diagram.

FIG. 12 shows a circuit diagram of a practical implementation where an operational amplifier 17a has been used, the output of which can be controlled to a high-impedance state. In the implementation, the value 100 nF has been used for the separating capacitor C1 of the direct voltage and the RC high-pass filter has been formed of a 10 nF capacitor C3 and of a 10 kΩ resistor R3. Via the resistor R3, also a reference voltage has been connected to the input of the operational amplifier 17a where the high-pass filtered signal Vin and the reference voltage Vref are summed. In addition, the R3 operates as a bias resistor of the operational amplifier. The reference to voltage Vref has been connected to the output signal Vout by a 10 kΩ resistor R1 which is preferably as high as the resistor R3. Since in the circuit shown in the example, a unipolar supply voltage+Vcc is used, the value of the reference voltage can be, for example, half of the value of the supply voltage. When bipolar supply voltage is used, the Vref can also be a zero potential.

By using the present invention it is possible to implement a direct conversion receiver which can be used in the construction of a mobile station. In mobile stations, the implementation of direct conversion receivers results in considerable cost savings since only one frequency synthetizer is necessary and there is no need for intermediate frequency parts or intermediate frequency filters. Also the RF shielding requirement for the device decreases and a duplex filter is not necessary. Thus it is possible to construct a mobile station which is smaller in size and lighter in weight by lower costs. Furthermore, the current consumption of the mobile station can be reduced.

By using the solution according to the present invention for reducing the offset voltage, considerable advantages can be achieved compared to solutions according to prior art:

digital signal processing is not necessary for correction of offset voltage, since offset voltage can be reduced reliably from an analog signal, the dynamic range of analog/digital converters need not be increased because of the offset voltage, the operation of reducing the offset voltage does not cause even a momentary interruption of the baseband signal in a signal line, the solution according to the invention can be implemented by a small number of components which thus require little space and little additional manufacturing cost, components which are needed in the circuit solution can be easily integrated to the connection of an A/D converter, the solution according to the invention increases the current consumption of a receiver by only a small amount by using this solution, problems created by clock signals and other interfering signals of a stable frequency which impact on the frequency of the received channel can be removed, which lessens the need for protection of the device and the solution is easy to add to receivers according to prior art such as mobile stations.

A solution according to the invention is applied preferably in receivers of digital time-division mobile communication systems such as GSM and PCN systems, but the invention can be applied also in receivers of analog systems, for example, if the received analog signal is converted to a digital form for signal processing.

Some embodiments of the solution according to the invention have been presented above. Naturally the principle according to the invention can be modified within the frame of the scope of the claims, for example, by modification of the details of the implementation and ranges of use. It should be noted that the presented circuit connections and component values have been described only as examples and they can be modified according to generally known design principles.

What is claimed is:

1. A method for reducing offset voltage of a first signal having a direct voltage component, comprising:

separating the direct voltage component from the first signal to produce a second signal without the direct voltage component;

high-pass filtering said first signal to produce a third signal;

summing a reference voltage with the third signal to produce a fourth signal; and combining the second signal with the fourth signal for a predetermined time.

2. A method according to claim 1, wherein said second signal appears on a signal line, said signal line having a lower limiting frequency and also acting as a high pass filter, wherein, in said high-pass filtering, a higher lower limiting frequency is used than that characteristic of said signal line.

3. A method according to claim 1, wherein said fourth signal is formed by summing a constant voltage with said third signal.

4. A method according to claim 3, said reference voltage is one of a fixed voltage and zero volts.

5. A circuit arrangement for reducing the offset voltage of a first signal, comprising:

separating means having an input for receiving the first signal and an output for providing a second signal, said separating means being for separating out a direct voltage component of the signal;

means including a high-pass filter for filtering said first signal, to form a third signal;

summing means for summing said third signal with a reference voltage to produce a forth signal;

means for connecting said fourth signal to the output of the separating means for a predetermined time.

6. A circuit arrangement according to claim 5, wherein said second signal appears on a signal line, said signal line having a lower limiting frequency, wherein the lower limiting frequency of said high-pass filter is higher than a lower limiting frequency of the signal line.

7. A circuit arrangement according to claim 5, wherein the reference voltage is one of a fixed voltage and zero volts.

8. A circuit arrangement according to claim 5, wherein said means for connecting the fourth signal comprises an operational amplifier and a controllable semiconductor switch.

9. A circuit arrangement according to claim 5, wherein said means for connecting the fourth signal comprises an operational amplifier, said operational amplifier having an output which is controllable to a high impedance state.

10. A circuit arrangement according to claim 5 further comprising, means for forming a control pulse and for feeding the control pulse to the means for connecting the fourth signal to the output of the separating means, for said predetermined time.

11. A circuit arrangement according to claim 5, in combination with a direct conversion receiver, the circuit arrangement being a part of said receiver.

12. A circuit arrangement according to claim 5, in combination with a mobile station receiver, the circuit arrangement being a part of said mobile station receiver.

13. A circuit arrangement according to claim 5, in combination with a digital, time-division mobile communications system, the circuit being a part of a telephone used in said communications system.

14. In a direct conversion receiver for reducing the offset voltage of a baseband signal, a method for reducing offset voltage of a first signal having a direct voltage component, comprising:

separating the direct voltage component from the first signal to produce a second signal without the direct voltage component;

high-pass filtering said first signal to produce a third signal;

summing a reference voltage with the third signal to produce a fourth signal; and combining the second signal with the fourth signal for a predetermined time.

15. In a receiver of a mobile station, a method for reducing offset voltage of a first signal having a direct voltage component, comprising:

separating the direct voltage component from the first signal to produce a second signal without the direct voltage component;

high-pass filtering said first signal to produce a third signal;

summing a reference voltage with the third signal to produce a fourth signal; and combining the second signal with the fourth signal for a predetermined time.

16. In a digital, time-division mobile communication system, a method for reducing offset voltage, of a first signal having a direct voltage component, in a telephone of said system, the method comprising:

separating the direct voltage component from the first signal to produce a second signal without the direct voltage component;

high-pass filtering said first signal to produce a third signal;

summing a reference voltage with the third signal to produce a fourth signal; and combining the second signal with the fourth signal for a predetermined time.

* * * * *